(12) United States Patent
Morgado et al.

(10) Patent No.: US 10,371,725 B1
(45) Date of Patent: Aug. 6, 2019

(54) OUT-OF-RANGE VOLTAGE DETECTION AND PROTECTION

(71) Applicant: Xilinx, Inc., San Jose, CA (US)

(72) Inventors: Alonso Morgado, Dublin (IE); Bruno Miguel Vaz, Sao Domingos de Rana (PT); Edward Cullen, Naas (IE); Christophe Erdmann, Dublin (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/994,060

(22) Filed: May 31, 2018

(51) Int. Cl.
| G08B 21/00 | (2006.01) |
| G01R 19/165 | (2006.01) |
| H02H 9/04 | (2006.01) |
| H03K 19/003 | (2006.01) |

(52) U.S. Cl.
CPC . *G01R 19/16595* (2013.01); *G01R 19/16528* (2013.01); *H02H 9/046* (2013.01); *H03K 19/00315* (2013.01); *H03K 19/00384* (2013.01)

(58) Field of Classification Search
CPC .................................. G01R 19/16595
USPC .................. 340/661, 662, 663, 540, 541
See application file for complete search history.

(56) References Cited

U.S. PATENT DOCUMENTS

| 5,629,639 | A * | 5/1997 | Williams | ............. H03K 5/1532 |
| | | | | 327/58 |
| 7,809,864 | B1 | 10/2010 | Young et al. | |
| 2006/0043981 | A1 * | 3/2006 | Drouin | ................. G01R 31/14 |
| | | | | 324/713 |
| 2012/0307877 | A1 * | 12/2012 | Delbecq | ................. H04B 1/16 |
| | | | | 375/224 |
| 2014/0266119 | A1 | 9/2014 | Burton et al. | |
| 2018/0180671 | A1 * | 6/2018 | Kalgren | ............... G01R 33/022 |
| 2018/0269722 | A1 * | 9/2018 | Xu | ........................ H02M 3/04 |

OTHER PUBLICATIONS

Modica, E., and Arkin, M., "Robust Amplifiers Provide Integrated Overvoltage Protection". Analog Dialogue, vol. 46, No. 1, Feb. 2012, pp. 3-6 and 23.
Burton, D., "Op Amp Input Overvoltage Protection: Clamping vs. Integrated". Analog Dialogue, vol. 50, No. 1, May 2016, pp. 17-19.

(Continued)

*Primary Examiner* — Tai T Nguyen
(74) *Attorney, Agent, or Firm* — Adam Davenport (57) ABSTRACT

Examples of the present disclosure provide out-of-range voltage detection and protection in integrated circuits (ICs). In some examples, an IC includes an envelope detector, a comparator, and a switch. The envelope detector is configured to generate an envelope signal of a signal and output the envelope signal on an output node of the envelope detector. A first input node of the comparator is coupled to the output node of the envelope detector. The comparator is configured to compare respective signals provided on the first and second input nodes of the comparator and generate a comparison signal in response to the comparison. The comparator is further configured to output the comparison signal on the output node of the comparator. The switch is connected between a protected node and a protection node and is configured to be selectively opened or closed based, at least in part, on the comparison signal.

20 Claims, 6 Drawing Sheets

(56) References Cited

OTHER PUBLICATIONS

Analog Devices, "Practical Design Considerations in Applyling the ADA4177 Family of Input Overvolatge Protection Operational Amplifiers", AN-1387, Application Note, pp. 1-4, Dec. 2015, http://www.analog.com/media/en/technical-documentation/application-notes/AN-1387.pdf
Wikipedia, "Crowbar (circuit)", May 30, 2018, pp. 1-2, downloaded from https://en.wikipedia.org/wiki/crowbar_%28circuit%29.
Jayamohan, Umesh, Analog Dialogue, "RF-Sampling ADC Input Protection: Not Black Magic After All", Apr. 2015, vol. 49, pp. 1-27, http://www.analog.com/en/analog-dialogue/articles/rf-samp-adc-input-protection.html.
Analog Devices, OVP and EMI Protected, Precision, Low Noise and Bias Current Op Amps, ADI Data-Sheets ADA4177-1, ADA4177-2 and ADA4177-4, pp. 1-33, May 2017, http://www.analog.com.
U.S. Appl. No. 15/616,872, filed Jun. 7, 2017, Vaz, Bruno Miguel, San Jose, CA USA.

* cited by examiner

OUT-OF-RANGE VOLTAGE DETECTION AND PROTECTION

This invention was made, in part, with Government support under Agreement No. HR0011-16-3-0004, awarded by Defense Advanced Research Projects Agency. The Government has certain rights in the invention.

TECHNICAL FIELD

Examples of the present disclosure generally relate to integrated circuits and, in particular, to integrated circuits having out-of-range voltage detection and protection.

BACKGROUND

Various integrated circuits (ICs) have been fabricated to include transistors that have differing thicknesses for gate dielectrics. By incorporating thin gate dielectric transistors with thick gate dielectric transistors in an IC, benefits may be achieved for the IC, such as higher operating speeds, lower parasitics, etc. However, the different transistors can have different characteristics that can cause the transistors to breakdown under different conditions, this especially being the case for the thin gate dielectric transistors. The breakdown of any transistor within an IC can cause failure of the IC. Hence, reliability of the transistors in the IC is generally a significant concern.

SUMMARY

Examples of the present disclosure provide out-of-range voltage detection and protection in integrated circuits. Various integrated circuits described herein can protect a circuit during a detected protection event, can be an integrated, on-chip solution that utilizes low area, can be implemented with low costs, and can permit high speeds and high performance.

An example of the present disclosure is an integrated circuit. The integrated circuit includes a first envelope detector, a first comparator, and a first switch. The first envelope detector has an input node and an output node. The first envelope detector is configured to generate an envelope signal of a signal provided on the input node of the first envelope detector and output the envelope signal on the output node of the first envelope detector. The first comparator has a first input node, a second input node, and an output node. The first input node of the first comparator is coupled to the output node of the first envelope detector. The first comparator is configured to compare a first signal provided on the first input node of the first comparator to a second signal provided on the second input node of the first comparator and generate a first comparison signal in response to the comparison. The first comparator is further configured to output the first comparison signal on the output node of the first comparator. The first switch is connected between a first protected node and a first protection node. The first switch is configured to be selectively opened or closed between the first protected node and the first protection node based, at least in part, on the first comparison signal.

Another example of the present disclosure is a method of operating an integrated circuit. A first envelope signal of an input signal is generated. The first envelope signal is compared to a first reference voltage to generate a first comparison signal. A control signal is generated based on, at least in part, the first comparison signal. A first switch is selectively opened or closed based on the control signal. The first switch is coupled between a first protected node and a first protection node.

Yet another example of the present disclosure is an integrated circuit. The integrated circuit includes a detection circuit, a protected circuit, and a protection circuit. The detection circuit includes a first envelope detector and a first comparator. The first envelope detector has an output node. The first envelope detector is configured to output a first detected envelope signal on the output node of the first envelope detector. The first comparator has a first input node, a second input node, and an output node. The first input node of the first comparator is coupled to the output node of the first envelope detector to receive the first detected envelope signal. The first comparator is configured to output a first comparison signal on the output node of the first comparator. The first comparison signal is based on a comparison of the first detected envelope signal to a signal on the second input node of the first comparator. The protected circuit has an internal node. The protection circuit comprises a switch coupled between the internal node and a protection node. The switch is controlled to be in an open state or a closed state based on, at least in part, the first comparison signal.

These and other aspects may be understood with reference to the following detailed description.

BRIEF DESCRIPTION OF THE DRAWINGS

So that the manner in which the above-recited features of the present disclosure can be understood in detail, a more particular description of the disclosure, briefly summarized above, may be had by reference to example implementations, some of which are illustrated in the appended drawings. It is to be noted, however, that the appended drawings illustrate only typical example implementations and are therefore not to be considered limiting of its scope, for the disclosure may admit to other equally effective examples.

To facilitate understanding, identical reference numerals have been used, where possible, to designate identical elements that are common to the figures. It is contemplated that elements of one example may be beneficially incorporated in other examples.

DETAILED DESCRIPTION

Examples of the present disclosure provide out-of-range voltage detection and protection in integrated circuits (ICs).

Generally, example implementations may be applicable to any circuit with devices that may break down or suffer damage under various conditions, such as transient high or low input voltages. Example circuits can detect protection events (e.g., when a signal has a voltage that is too high or too low for the devices being protected) and can, in response, connect nodes of the circuit that is being protected to voltages that can allow the protected devices to be in a safe, power-down operation. In some examples described herein, there may be no current flowing in the protected circuit during a protection event such that no current driving capability by the circuit that protects the protected circuit is required. The circuit that detects the protection events can further detect when the protection events are no longer occurring and can permit the circuit being protected to resume normal operation. Some examples can provide a flexible, integrated, and low-cost solution to protect circuits in out-of-range voltage events. These and other possible advantages will become apparent from the description herein.

In some ICs, thin gate dielectric (e.g., oxide) transistors can provide better performance compared to thicker gate dielectric transistors. This improved performance may be noticeable at high speeds due to, for example, the capability of the thin gate dielectric transistors to provide a higher transconductance with lower parasitics relative to thick gate dielectric transistors. However, the thin gate dielectric transistors may break down and/or be permanently damaged at lower drain-to-source and/or gate-to-source voltages relative to the thick gate dielectric transistors. Hence, lower voltage supplies are typically used for thin gate dielectric transistors, while higher voltage supplies are usually employed for thick gate dielectric transistors.

Sometimes, an IC with both thin gate dielectric transistors and thick gate dielectric transistors provides a solution with improved performance, but the IC may lack robustness and may be prone to breakdown and/or permanent damage. The IC may be particularly prone to breakdown or permanent damage when a signal that is too high or too low is input to the IC.

Some examples described herein can protect a set of devices when a thin gate dielectric device (or just a device that operates with a lower voltage) is to be protected. The circuit includes an out-of-range voltage detection circuit and a protection circuit for a protected circuit. A digital signal is activated when an out-of-range signal is detected, and the protection circuit is activated which causes the protected circuit to be set in protection mode (e.g., power-down) until the signal returns to a normal range.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples, even if not so illustrated or if not so explicitly described. Further, unless a specific context dictates otherwise, use of the terms "positive" and "negative" herein does not indicate, e.g., a positive voltage or negative voltage, respectively, but can indicate, for example, a differential signal or other corresponding signals.

Figure 1:
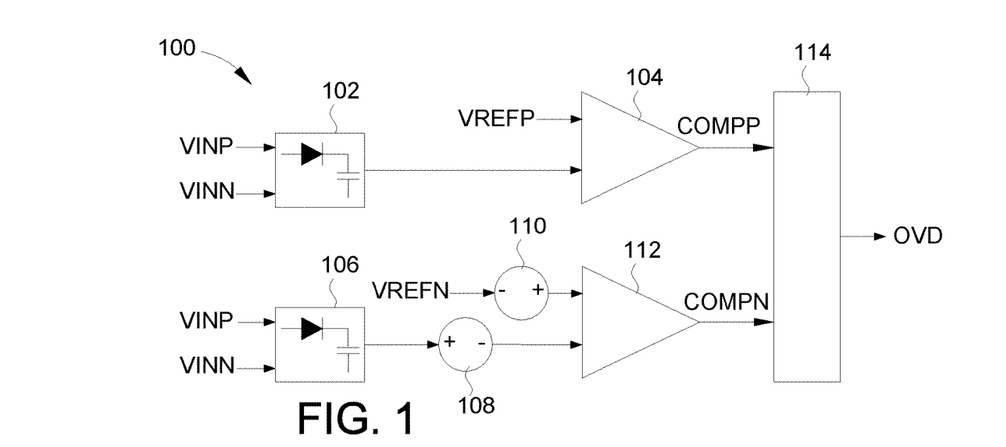
FIG. 1 is a schematic of an out-of-range voltage detection circuit, in accordance with some examples of the present disclosure.

FIG. 1 illustrates a schematic of an out-of-range voltage detection circuit 100, in accordance with some examples of the present disclosure. The out-of-range voltage detection circuit 100 includes a positive envelope detector circuit 102, a first comparator 104, a negative envelope detector circuit 106, a first level shifter circuit 108, a second level shifter circuit 110, a second comparator 112, and a logic circuit 114. The positive envelope detector circuit 102 has two input nodes corresponding to a positive input signal VINP and a negative input signal VINN, defined as its inputs. The positive envelope detector circuit 102 is configured to detect the positive envelope corresponding to the input signals VINP and VINN that is input on the input nodes of the positive envelope detector circuit 102. The positive envelope detector circuit 102 has an output node on which the positive envelope detector circuit 102 outputs the positive envelope signal that was detected based on the input signals VINP and VINN.

The output node of the positive envelope detector circuit 102 is connected to an input node of the first comparator 104, and hence, the positive envelope signal is input into the first comparator 104. A positive reference voltage VREFP is input on another input node of the first comparator 104. In some examples, respective level shifter circuits may be disposed between the output node of the positive envelope detector circuit 102 and the input node of the first comparator 104, and between the positive reference voltage VREFP and the other input node of the first comparator 104, similar to the first level shifter circuit 108 and second level shifter circuit 110 described subsequently. The first comparator 104 compares the voltage levels of the positive envelope signal with the positive reference voltage VREFP and outputs on an output node of the first comparator 104 a positive comparison signal COMPP. The positive comparison signal COMPP is a logical "1" when the positive envelope signal has a voltage greater than the positive reference voltage VREFP, and is a logical "0" when the positive reference voltage VREFP is greater than the voltage of the positive envelope signal. In other examples, logical signals that are inverted from the preceding example may be implemented.

In some examples, the positive reference voltage VREFP is generated by a programmable reference voltage generator circuit that is capable of altering or adjusting the positive reference voltage VREFP, while in other examples, the positive reference voltage VREFP is generated by a reference voltage generator circuit that is not capable of altering or adjusting the positive reference voltage VREFP. Example reference voltage generator circuits include a resistor ladder, a digital-to-analog converter, a low-dropout regulator, or the like. When the positive reference voltage VREFP can be altered, the out-of-range voltage detection circuit 100 can be flexible to detect when the positive envelope signal is out of range based on any of different positive reference voltages.

The negative envelope detector circuit 106 has two input nodes corresponding to the positive input signal VINP and the negative input signal VINN, defined as its inputs. The negative envelope detector circuit 106 is configured to detect the negative envelope of the input signals VINP and VINN that are input on the input nodes of the negative envelope detector circuit 106. The negative envelope detector circuit 106 has an output node on which the negative envelope detector circuit 106 outputs the negative envelope signal that was detected based on the input signals VINP and VINN.

The output node of the negative envelope detector circuit 106 is connected to an input node (e.g., positive node) of the first level shifter circuit 108, and an output node (e.g., negative node) of the first level shifter circuit 108 is connected to an input node of the second comparator 112. Hence, the negative envelope signal is input into the first level shifter circuit 108. The first level shifter circuit 108 is configured to shift a voltage level of the negative envelope signal. The first level shifter circuit 108 outputs the shifted negative envelope signal on the output node of the first level shifter circuit 108, and hence, the shifted negative envelope signal is input into the second comparator 112. A negative reference voltage VREFN is input on an input node (e.g., negative node) of the second level shifter circuit 110, and an output node (e.g., positive node) of the second level shifter circuit 110 is connected to another input node of the second comparator 112. The second level shifter circuit 110 is configured to shift a voltage level of the negative reference voltage VREFN. The second level shifter circuit 110 outputs the shifted negative reference voltage on the output node of the second level shifter circuit 110, and hence, the shifted negative reference voltage is input into the second comparator 112. In other examples, either or both of the first level shifter circuit 108 and the second level shifter circuit 110 (or any other level shifter circuit) may be connected between respective components using an opposite polarity from what is illustrated and described (e.g., the output node of the negative envelope detector circuit 106 may be connected to a negative node of the first level shifter circuit 108). Additionally, in some examples, the first level shifter circuit 108 and the second level shifter circuit 110 are omitted.

The second comparator 112 compares the voltage levels of the shifted negative envelope signal with the shifted negative reference voltage and outputs on an output node of the second comparator 112 a negative comparison signal COMPN. The negative comparison signal COMPN is a logical "1" when the shifted negative envelope signal has a voltage less than the shifted negative reference voltage, and is a logical "0" when the shifted negative reference voltage is less than the voltage of the shifted negative envelope signal. In other examples, logical signals that are inverted from the preceding example may be implemented.

In some examples, the negative reference voltage VREFN is generated by a programmable reference voltage generator circuit that is capable of altering or adjusting the negative reference voltage VREFN, while in other examples, the negative reference voltage VREFN is generated by a reference voltage generator circuit that is not capable of altering or adjusting the negative reference voltage VREFN. Further, in some examples, the first level shifter circuit 108 and/or the second level shifter circuit 110 (and any other level shifter circuits) are programmable to shift the voltage level of the respective input signal by a programmable amount, while in other examples, the first level shifter circuit 108 and/or the second level shifter circuit 110 (or any other level shifter circuits) are not programmable. When the negative reference voltage VREFN can be altered and/or the first level shifter circuit 108 and/or the second level shifter circuit 110 are programmable, the out-of-range voltage detection circuit 100 can be flexible to detect when the negative envelope signal is out of range based on any of different negative reference voltages. Further, by implementing the first level shifter circuit 108 and/or the second level shifter circuit 110 (or one or more level shifter circuits to level shift a signal input to the first comparator 104), the same design for the first comparator 104 and the second comparator 112 may be implemented. For example, different level shifter circuits can accommodate differing threshold values of the first comparator 104 and second comparator 112. By using level shifter circuits, such as illustrated and described with respect to the first level shifter circuit 108 and second level shifter circuit 110, signals that are input into a respective comparator may be level shifted, such as to change the effective reference voltage input into the comparator (e.g., by adding or subtracting some DC voltage from the reference voltage provided to the level shifter circuit).

The respective output nodes of the first comparator 104 and the second comparator 112 are connected to input nodes of the logic circuit 114. The logic circuit 114 has an output node on which the logic circuit 114 outputs an out-of-range detection signal OVD. The out-of-range detection signal OVD indicates when any of the input signals VINP and VINN is outside of a desired voltage range, such as set by the reference voltages VREFP and VREFN and any level shifter circuits (e.g., level shifter circuits 108 and 110). The logic circuit 114 can be or include any combinational logic. In a simple form, the logic circuit 114 is an OR gate that ORs the positive comparison signal COMPP and negative comparison signal COMPN to generate the out-of-range detection signal OVD. Other logic may be included to, for example, provide for an enable signal to enable/disable the logic circuit 114 and/or to control the out-of-range detection signal OVD to be in a desired condition for powering up or down the protected circuit. Also, although not illustrated, the logic circuit 114 can include a buffer to output the out-of-range detection signal OVD.

In some examples, one or more of the first comparator 104 and second comparator 112 (and any other comparator described below) may include or be replaced by a Schmitt trigger that includes hysteresis. This may prevent the comparator to trigger with small amounts of noise (from, e.g., the comparator itself) when the signal is near the corresponding threshold.

In some examples, an envelope detector circuit that follows the common-mode voltage of the input signals VINP and VINN can be implemented, such as for protection with respect to the common-mode voltage, if desired.

Figure 2:
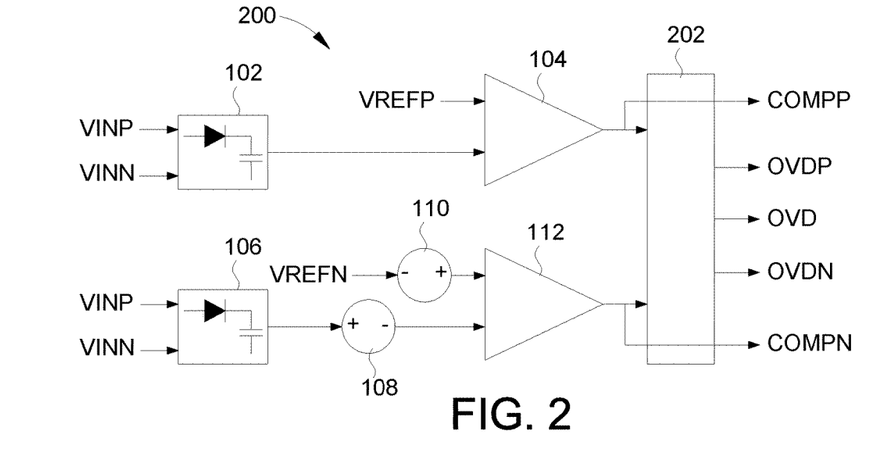
FIG. 2 is a schematic of another out-of-range voltage detection circuit, in accordance with some examples of the present disclosure.

FIG. 2 illustrates a schematic of an out-of-range voltage detection circuit 200, in accordance with some examples of the present disclosure. The out-of-range voltage detection circuit 200 of FIG. 2 differs from the out-of-range voltage detection circuit 100 of FIG. 1 by the logic circuit 202 and output signals. The out-of-range voltage detection circuit 200 outputs the positive comparison signal COMPP, the negative comparison signal COMPN, a positive out-of-range detection signal OVDP, a negative out-of-range detection signal OVDN, and the out-of-range detection signal OVD. The positive comparison signal COMPP and the negative comparison signal COMPN are output from the respective output nodes of the first comparator 104 and the second comparator 112.

The logic circuit 202 includes the logic of logic circuit 114 to output the out-of-range detection signal OVD. The logic circuit 202 further has output nodes on which the logic circuit 202 outputs the positive out-of-range detection signal OVDP and the negative out-of-range detection signal OVDN. The logic circuit 202 can be or include any combinational logic.

The positive out-of-range detection signal OVDP indicates when any of the input signals VINP and VINN exceeds an upper threshold of the desired voltage range, but is not below a lower threshold of the desired voltage range. Assertion of the positive out-of-range detection signal OVDP can indicate, e.g., that the common-mode voltage of the input signals VINP and VINN is too high. In a simple form, the logic circuit 202 to generate the positive out-of-range detection signal OVDP can include an inverter and an AND gate. The inverter inverts the negative comparison signal COMPN to obtain a complementary negative comparison signal COMPNB, and the AND gate ANDs together the complementary negative comparison signal COMPNB and the positive comparison signal COMPP to obtain the positive out-of-range detection signal OVDP.

The negative out-of-range detection signal OVDN indicates when any of the input signals VINP and VINN is below a lower threshold of the desired voltage range, but does not exceed an upper threshold of the desired voltage range. Assertion of the negative out-of-range detection signal OVDN can indicate, e.g., that the common-mode voltage of the input signals VINP and VINN is too low. In a simple form, the logic circuit 202 to generate the negative out-of-range detection signal OVDN can include an inverter and an AND gate. The inverter inverts the positive comparison signal COMPP to obtain a complementary positive comparison signal COMPPB, and the AND gate ANDs together the complementary positive comparison signal COMPPB and the negative comparison signal COMPN to obtain the negative out-of-range detection signal OVDN. Also, although not illustrated, the logic circuit 202 can include respective buffers to output the positive out-of-range detection signal OVDP and the negative out-of-range detection signal OVDN.

The various signals output by the out-of-range voltage detection circuit 200 can be used by other circuits to address various conditions. For example, a common-mode input voltage can be decreased or increased based on the assertion of the positive out-of-range detection signal OVDP and the negative out-of-range detection signal OVDN. Other actions can occur in response to the various signals.

Figure 3:
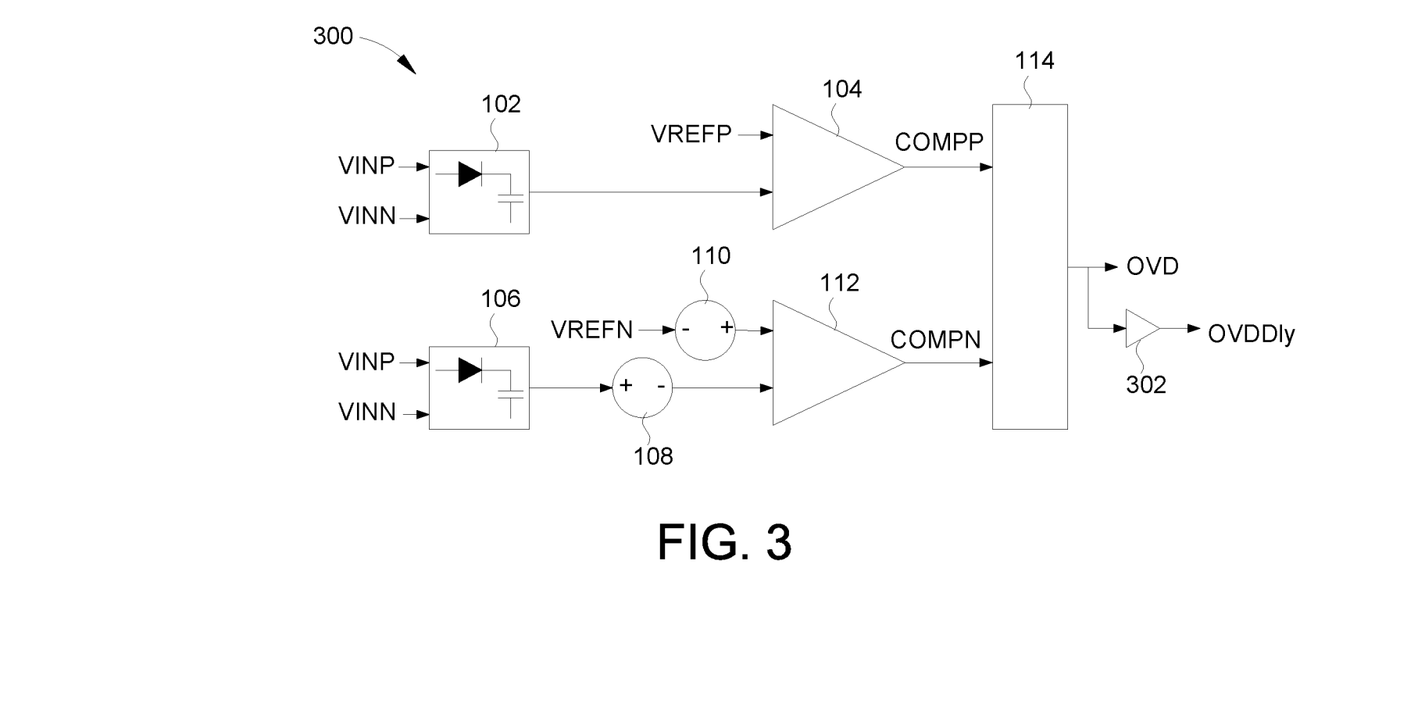
FIG. 3 is a schematic of an additional out-of-range voltage detection circuit, in accordance with some examples of the present disclosure.

FIG. 3 illustrates a schematic of an out-of-range voltage detection circuit 300, in accordance with some examples of the present disclosure. The out-of-range voltage detection circuit 300 of FIG. 3 differs from the out-of-range voltage detection circuit 100 of FIG. 1 by the inclusion of a delay element 302 and the output of a delayed out-of-range detection signal OVDDly. The output node of the logic circuit 114 is connected to an input node of the delay element 302. The delay element 302 has an output node on which the delay element 302 outputs the delayed out-of-range detection signal OVDDly. The delay element 302 can be programmable to adjust the amount of delay between the out-of-range detection signal OVD and the delayed out-of-range detection signal OVDDly. The out-of-range detection signal OVD and the delayed out-of-range detection signal OVDDly can be implemented to control various elements of a protection circuit to coordinate appropriate timing of those elements. Any number of delay elements that output delayed signals with any amount of delay can be implemented.

Figure 4:
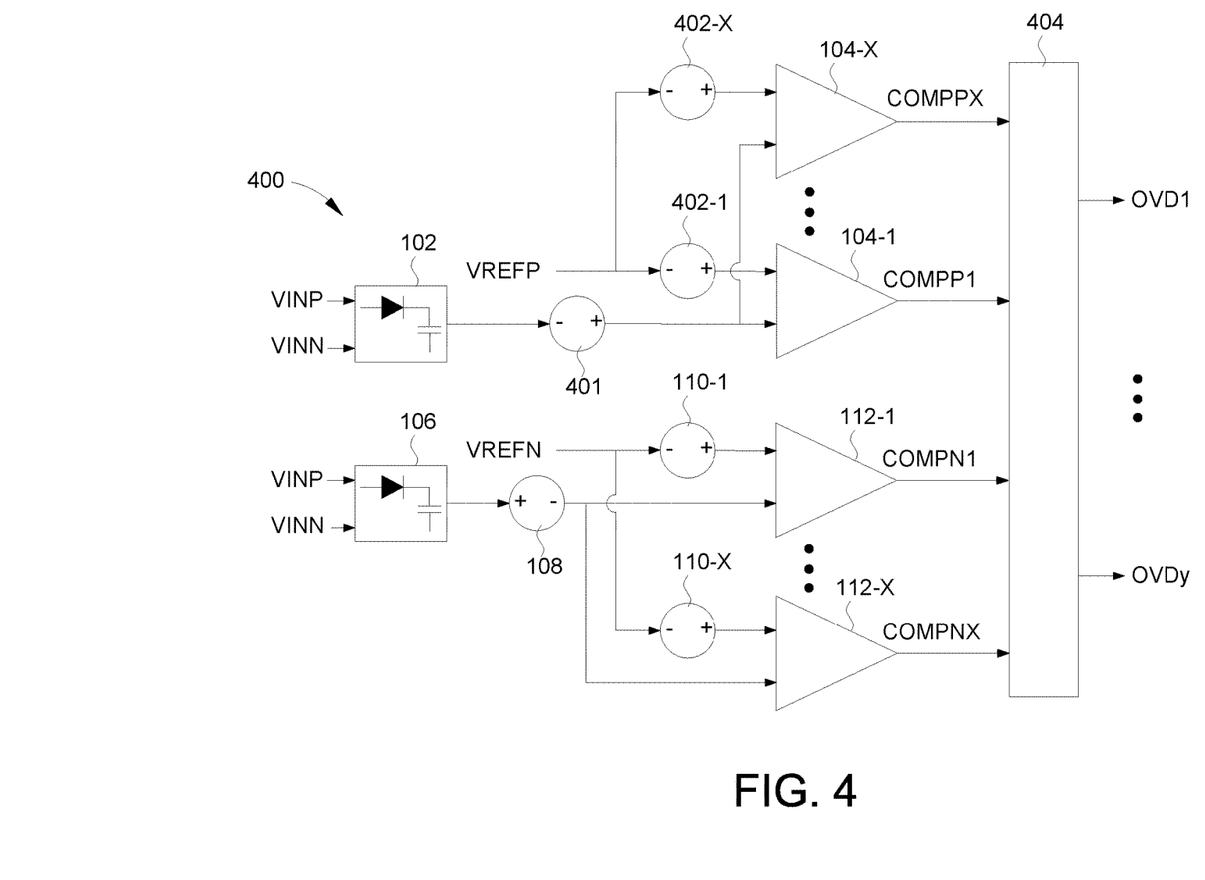
FIG. 4 is a schematic of a further out-of-range voltage detection circuit, in accordance with some examples of the present disclosure.

FIG. 4 illustrates a schematic of an out-of-range voltage detection circuit 400, in accordance with some examples of the present disclosure. The out-of-range voltage detection circuit 400 of FIG. 4 differs from the out-of-range voltage detection circuit 100 of FIG. 1 by the inclusion of multiple additional comparators and level shifter circuits and by logic circuit 404.

The output node of the positive envelope detector circuit 102 is connected to an input node of a first level shifter circuit 401, and an output node of the first level shifter circuit 401 is connected to respective input nodes of first comparators 104-1 through 104-X. Hence, the positive envelope signal is input into the first level shifter circuit 401, which shifts a voltage level of the positive envelope signal and outputs the shifted positive envelope signal on the output node of the first level shifter circuit 401. Hence, the shifted positive envelope signal is input into the first comparators 104-1 through 104-X. The positive reference voltage VREFP is input on respective input nodes of second level shifter circuits 402-1 through 402-X, and respective output nodes of the second level shifter circuits 402-1 through 402-X are connected to other input nodes of the first comparators 104-1 through 104-X. The second level shifter circuits 402-1 through 402-X are configured to shift a voltage level of the positive reference voltage VREFP by differing amounts (e.g., by adding or subtracting a DC voltage). The second level shifter circuits 402-1 through 402-X output the shifted positive reference voltages on the output nodes of the second level shifter circuits 402-1 through 402-X, and hence, the shifted positive reference voltages are input into the respective first comparators 104-1 through 104-X. Hence, the first comparators 104-1 through 104-X have different reference voltages input on their other respective input nodes.

The first comparators 104-1 through 104-X compare the voltage levels of the shifted positive envelope signal with the input reference voltages and output on respective output nodes of the first comparators 104-1 through 104-X respective positive comparison signals COMPP1 through COMPPX. The positive comparison signals COMPP1 through COMPPX are a logical "1" when the shifted positive envelope signal has a voltage greater than the respective reference voltage, and is a logical "0" when the respective reference voltage is greater than the voltage of the shifted positive envelope signal. In other examples, logical signals that are inverted from the preceding example may be implemented. Other configurations may be implemented to compare the positive envelope signal to different reference voltages, such as with or without various level shifter circuits.

The output node of the negative envelope detector circuit 106 is connected to an input node of the first level shifter circuit 108, and an output node of the first level shifter circuit 108 is connected to respective input nodes of second comparators 112-1 through 112-X. Hence, the negative envelope signal is input into the first level shifter circuit 108, which shifts a voltage level of the negative envelope signal and outputs the shifted negative envelope signal on the output node of the first level shifter circuit 108. Hence, the shifted negative envelope signal is input into the second comparators 112-1 through 112-X. A negative reference voltage VREFN is input on respective input nodes of second level shifter circuits 110-1 through 110-X, and respective output nodes of the second level shifter circuits 110-1 through 110-X are connected to other input nodes of the second comparators 112-1 through 112-X. The second level shifter circuits 110-1 through 110-X are configured to shift a voltage level of the negative reference voltage VREFN by differing amounts. The second level shifter circuits 110-1 through 110-X output the shifted negative reference voltages on the output nodes of the second level shifter circuits 110-1 through 110-X, and hence, the shifted negative reference voltages are input into the respective second comparators 112-1 through 112-X.

The second comparators 112-1 through 112-X compare the voltage levels of the shifted negative envelope signal with the respective shifted negative reference voltages and output on output nodes of the second comparators 112-1 through 112-X respective negative comparison signals COMPN1 through COMPNX. The negative comparison signals COMPN1 through COMPNX are a logical "1" when the shifted negative envelope signal has a voltage less than the respective shifted negative reference voltage, and are a logical "0" when the respective shifted negative reference voltage is less than the voltage of the shifted negative envelope signal. In other examples, logical signals that are inverted from the preceding example may be implemented.

The respective output nodes of the first comparators 104-1 through 104-X and the second comparators 112-1 through 112-X are connected to input nodes of the logic circuit 404. The logic circuit 404 has output nodes on which the logic circuit 404 outputs different out-of-range detection signals OVD1 through OVDy. The out-of-range detection signals OVD1 through OVDy indicate when any of the input signals VINP and VINN is outside of particular ones of multiple voltage ranges, such as set by the reference voltages input to the various comparators. The logic circuit 404 can be or include any combinational logic. In a simple form, the logic circuit 404 includes an OR gate that ORs the positive comparison signal COMPP1 and negative comparison signal COMPN1 to generate the out-of-range detection signal OVD1, an OR gate that ORs the positive comparison signal COMPP2 and negative comparison signal COMPN2 to generate the out-of-range detection signal OVD2, etc. Other logic may be included to, for example, provide for an enable signal to enable/disable the logic circuit 404 and/or to control the out-of-range detection signals OVD1 through OVDy to be in a desired condition for powering up or down the protected circuit.

By comparing the envelope signals to different reference voltages, different conditions can be detected. For example, a condition when any of the input signals VINP and VINN is outside of a small voltage range may be detected to trigger a least drastic response to protect a circuit. Further, for example, a condition when any of the input signals VINP and VINN is outside of a large voltage range may be detected to trigger a more drastic response to protect a circuit.

Various level shifter circuits are illustrated in the out-of-range voltage detection circuit 400 of FIG. 4 to provide an example to illustrate different reference voltages. Other implementations may omit various ones of the level shifter circuits or have level shifter circuits connected differently to achieve similar detection. For example, multiple different reference voltage circuits may be implemented to obviate any level shifter circuits. A person having ordinary skill in the art will readily understand other configurations that may be implemented.

The out-of-range voltage detection circuits 100, 200, 300, and 400 of FIGS. 1 through 4 illustrate various modifications that may be made to an out-of-range voltage detection circuit. Various aspects of those examples can be combined to implement another out-of-range voltage detection circuit, while some aspects may be omitted in various examples. For example, an out-of-range voltage detection circuit may include various circuits described in the examples above to output out-of-range detection signal OVD, positive out-of-range detection signal OVDP, negative out-of-range detection signal OVDN, delayed out-of-range detection signal OVDDly, and/or out-of-range detection signals OVD1 through OVDy. Another example may use more envelope detectors (e.g., similar to the envelope detector circuits 102 and 106) with more input signals (e.g., similar to input signals VINP and VINN), together with comparators and/or level shifter circuits to add more protection events if desired.

Figure 5:
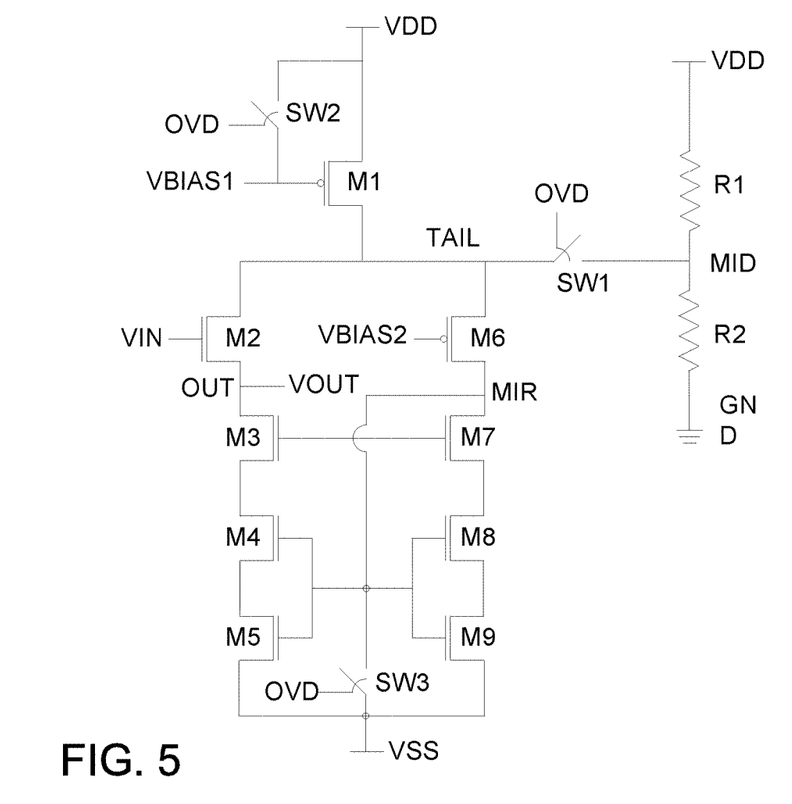
FIG. 5 is a schematic of a protected circuit and a protection circuit, in accordance with some examples of the present disclosure.

FIG. 5 illustrates a schematic of a protected circuit and a protection circuit, in accordance with some examples of the present disclosure. As will become apparent, in some examples, there may be no clear demarcation between the protected circuit and the protection circuit; for example, some elements of the protection circuit may be embedded in the protected circuit.

The protected circuit includes a buffer. The buffer includes transistors M1 through M9. The transistors M1 and M6 are p-type transistors (e.g., p-type metal-oxide-semiconductor field effect transistors (MOSFETs)), and the transistors M2, M3, M4, M5, M7, M8, and M9 are n-type transistors (e.g., n-type MOSFETs). In some examples, the transistors M1, M3, M4, M5, M7, M8, and M9 are thin gate dielectric (e.g., oxide) devices, while transistors M2 and M6 are thick gate dielectric (e.g., oxide) devices. In other examples, other types of devices (e.g., bipolar junction transistor (BJT), other type of transistor, etc.) or other circuits may be implemented in and/or as the protected circuit. The protection circuit includes switches SW1, SW2, and SW3 and a voltage generator circuit.

The source of the transistor M1 is connected to a first power node VDD, and the drain of the transistor M1 is connected to a tail node TAIL. A first bias voltage VBIAS1 is input to the gate of the transistor M1. The drain of the transistor M2 is connected to the tail node TAIL, and the source of the transistor M2 is connected to an output node OUT and to the drain of the transistor M3. An input signal VIN is input to the gate of the transistor M2. An output signal VOUT is output on the output node OUT. The source of the transistor M3 is connected to the drain of the transistor M4. The source of the transistor M4 is connected to the drain of the transistor M5. The source of the transistor M5 is connected to a second power node VSS (e.g., ground node GND). The source of the transistor M6 is connected to the tail node TAIL, and the drain of the transistor M6 is connected to a mirror node MIR and to the drain of the transistor M7. A second bias voltage VBIAS2 is input to the gate of the transistor M6. The source of the transistor M7 is connected to the drain of the transistor M8. The source of the transistor M8 is connected to the drain of the transistor M9. The source of the transistor M9 is connected to a second power node VSS (e.g., ground node GND). The gates of the transistors M3 and M7 are connected together. The gates of the transistors M4, M5, M8, and M9 are connected together and to the mirror node MIR.

The first switch SW1 is connected between the tail node TAIL and the voltage generator circuit. The voltage generator circuit in this example is a resistor voltage divider or a resistor ladder. As illustrated, a first resistor R1 is connected between a first power node VDD and a mid-voltage supply node MID, and a second resistor R2 is connected between the mid-voltage supply node MID and a ground node GND. In some examples, one or more decoupling capacitors may be included in the voltage divider, such as connected between the mid-voltage supply node MID and the ground node GND in parallel with the second resistor R2. The first switch SW1 is connected to the mid-voltage supply node MID. Other circuits, such as a digital-to-analog converter (DAC), bandgap reference circuit, a low-dropout regulator, or the like, can be implemented instead of or in addition to the voltage divider or resistor ladder as the voltage generator circuit. The second switch SW2 is connected between the gate of the transistor M1 and the first power node VDD (or the source of the transistor M1). The third switch SW3 is connected between the mirror node MIR (or the gates of the transistors M4, M5, M8, and M9) and the second power node VSS (e.g., ground node GND). In some examples, the second switch SW2 and the third switch SW3 may be omitted, such as when the voltage generator circuit is capable of driving the buffer without a significant change in the voltage of the mid-voltage supply node MID, and thus, in the voltage of the tail node TAIL, in a power-down event.

The switches SW1, SW2, and SW3 are controlled to be in an opened or closed state based on the out-of-range detection signal OVD. Generally, the switches SW1, SW2, and SW3 are opened when the input signals VINP and VINN are within the desired voltage range as indicated by the out-of-range detection signal OVD, and are closed when any of the input signals VINP and VINN is outside of the desired voltage range as indicated by the out-of-range detection signal OVD. The switches SW1, SW2, and SW3 can be or include a transistor, a transmission gate, or the like. Depending on the type of switch implemented, the out-of-range detection signal OVD may be inverted to effectuate the control of the switch. For example, a transmission gate may use the out-of-range detection signal OVD and a complementary out-of-range detection signal OVDB to control the state of the transmission gate. Hence, one or more inverters may be implemented in the switches SW1, SW2, and SW3, the logic circuit 114, 202, and 404, or another circuit.

Generally, when the input signals VINP and VINN are within the desired voltage range, the switches SW1, SW2, and SW3 are open, and the buffer operates normally. Generally, when any of the input signals VINP and VINN is outside of the desired voltage range, the switches SW1, SW2, and SW3 are closed, and current stops flowing through the transistors of the buffer. Hence, the buffer may be protected from over or under voltage occurrences. More specifically, the gate-to-source voltage ($V_{GS}$) of each of the transistors M1, M4, M5, M8, and M9 is zero since the gate is coupled to the respective source when the switches SW2 and SW3 are closed, which can prevent current from flowing in the buffer. In some examples, one or more additional switches may be connected to the gates of transistors M3 and M7 for further protection of the transistors M3 and M7. Further, the tail node TAIL is brought to the voltage of the mid-voltage supply node MID when the first switch SW1 is closed. As stated above, in some examples, the voltage generator circuit may be capable of driving the buffer without a significant change in the voltage of the mid-voltage supply node MID, and thus, in the voltage of the tail node TAIL, in a power-down event, which can permit the second switch SW2 and third switch SW3 to be omitted. In some examples, an analog buffer may be used if the mid-voltage supply node MID needs to be driven in other applications or circuits.

In some examples, a spurious peak may be generated in the output signal on the output node OUT when the switches SW1, SW2, and SW3 are simultaneously closed from an open state. For example, capacitive coupling in the buffer during the switching event can generate the spurious peak. In such examples, the delayed out-of-range detection signal OVDDly can be implemented to control the switches SW2 and SW3, while the out-of-range detection signal OVD is implemented to control the first switch SW1. By implementing the delayed out-of-range detection signal OVDDly and out-of-range detection signal OVD in this manner, the effects of capacitive coupling may be reduced, which can result in a reduced spurious peak.

In some examples, the logic circuits 114, 202, and 404 of FIGS. 1 through 4 can be omitted, and in such examples, the switches SW1, SW2, and SW3 can be controlled by, for example, the positive comparison signal COMPP (or other similar signal, such as positive comparison signal COMPX). In such scenarios, the protected circuit may be protected from over-voltage events. Other examples can omit the logic circuits 114, 202, and 404 of FIGS. 1 through 4.

Figure 6:
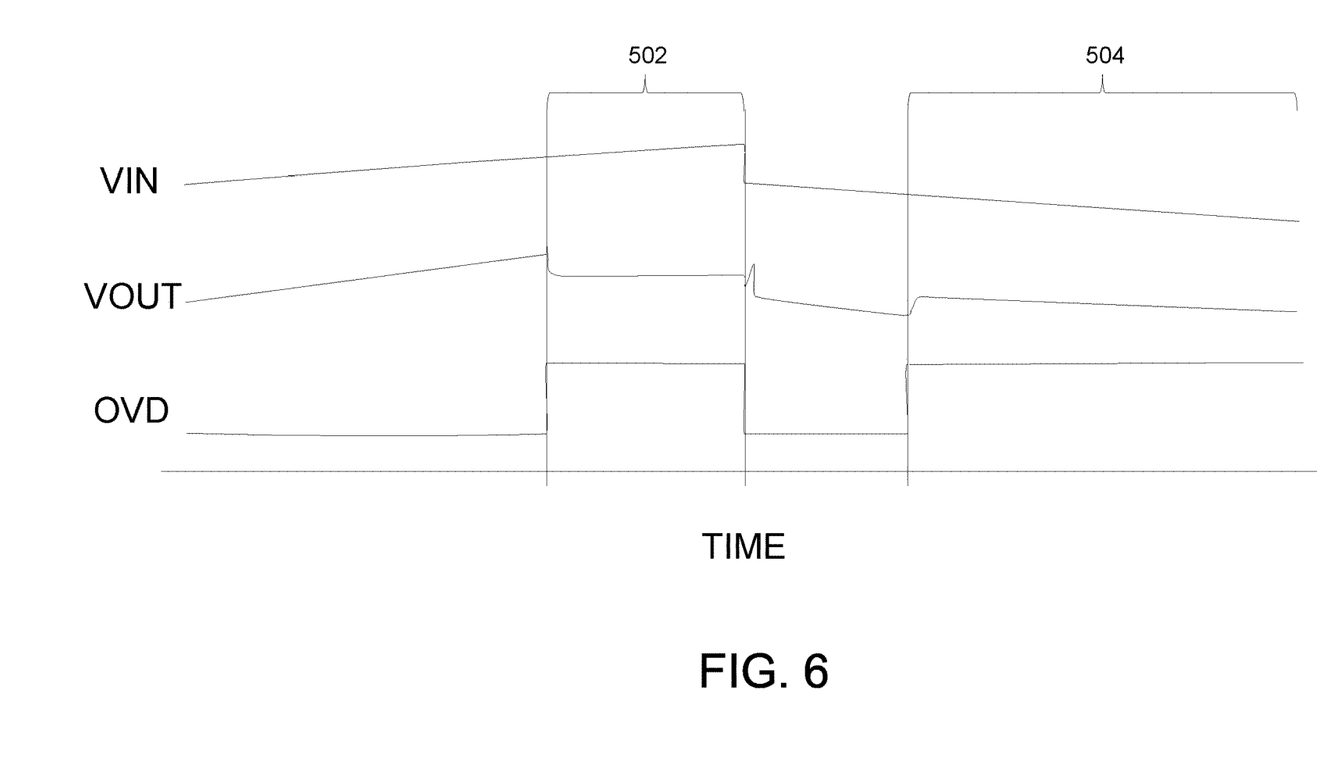
FIG. 6 is a graph of example waveforms of signals in a protected circuit, in accordance with some examples of the present disclosure.

FIG. 6 illustrates example waveforms of signals in the protected circuit, in accordance with some examples of the present disclosure. Initially, the input signal VIN is within the desired voltage range and begins to increase. As the input signal VIN increases to a voltage within a first protection event 502, the input signal VIN exceeds the desired voltage range. As the input signal VIN transitions out of the first protection event 502, the voltage of the input signal VIN drops to be within the desired voltage range and begins to decrease. As the input signal VIN decreases to a voltage within a second protection event 504, the input signal VIN is below the desired voltage range. When the voltage of the input signal VIN exceeds or is below the desired voltage range in the protection events 502 and 504, the out-of-range detection signal OVD is asserted (e.g., is a logical "1"). In other regions where the voltage of the input signal VIN is with the desired voltage range, the out-of-range detection signal OVD is not asserted (e.g., is a logical "0"). Hence, the voltage of the output signal VOUT follows the voltage of the input signal VIN, except in the protection events 502 and 504 when the voltage of the input signal VIN exceeds or is below the desired voltage range. In those protection events 502 and 504, the voltage of the output signal VOUT is prevented from further increase, since the mid-voltage supply node MID is electrically connected to the tail node TAIL (via a closed first switch SW1) such that the voltage of the mid-voltage supply node MID becomes the voltage of the tail node TAIL.

Figure 7:
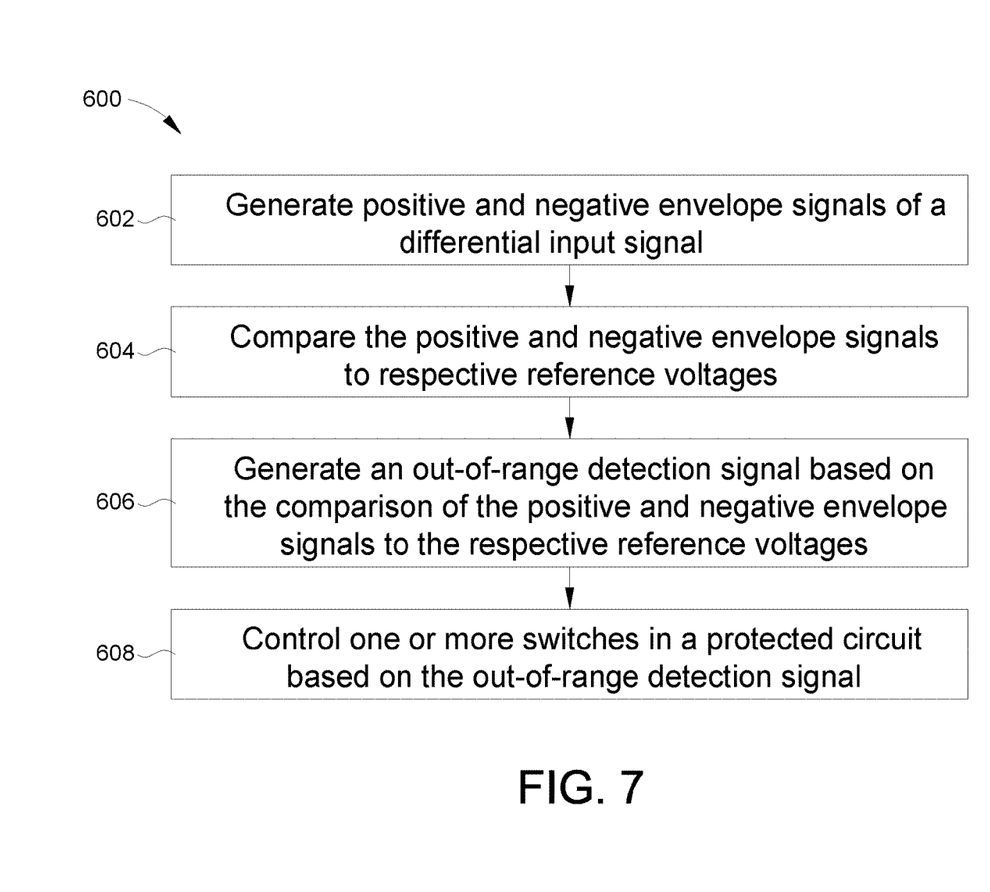
FIG. 7 is a flow chart of a method for operating a circuit, in accordance with some examples of the present disclosure.

FIG. 7 is a flow chart of a method 600 for operating a circuit, in accordance with some examples of the present disclosure. In operation 602, positive and negative envelope signals of an input signal are generated. For example, the positive envelope detector circuit 102 and the negative envelope detector circuit 106 can generate the positive envelope signal and the negative envelope signal, respectively, of the input signals VINP and VINN. In operation 604, the positive and negative envelope signals are compared to respective reference voltages. Any of the envelope signals and/or reference voltages can be shifted to accommodate any circuitry, such as illustrated by the implementation of the first level shifter circuit 108 and the second level shifter circuit 110. The first comparator 104 can compare the positive envelope signal to a positive reference voltage VREFP, and the second comparator 112 can compare the negative envelope signal to a negative reference voltage VREFN. In operation 606, an out-of-range signal is generated based on the comparison of operation 604. For example, the first comparator 104 can generate a positive comparison signal COMPP that is input into the logic circuit 114, 202, or 404, and the second comparator 112 can generate a negative comparison signal COMPN that is input into the logic circuit 114, 202, or 404. Based on the positive comparison signal COMPP and negative comparison signal COMPN, the logic circuit 114, 202, or 404 can generate the out-of-range detection signal OVD. In operation 608, one or more switches in a protected circuit are controlled based on the out-of-range signal. For example, the switches SW1, SW2, and SW3 are controlled based on the out-of-range detection signal OVD to be in open or closed states. The switches SW1, SW2, and SW3 being controlled in such a manner can protect the protected circuit when the input signal is out of range.

According to some examples, an out-of-range voltage detection circuit and protection circuit can be implemented on-chip with the protected circuit, e.g., as an integrated solution. In an integrated solution, the out-of-range voltage detection circuit and protection circuit can be implemented in a small area of the chip, can use low power, and be low cost. Further, the integrated solution can have low parasitics that can result in high performance at high speeds (e.g., high signal bandwidth, high-frequency impedance matching, etc.). Also, performance of the integrated solution can be easier to verify and quantify compared to if, for example, the out-of-range voltage detection circuit and protection circuit was off-chip. Impedances can be matched easier with an integrated solution.

In some examples, the out-of-range detection signal can be a digital signal that is utilized by various circuits. For example, in addition to the protection circuit, other circuits in the system in which the out-of-range voltage detection circuit is implemented can utilize the out-of-range voltage detection circuit to adjust the input signal attenuation when the signal becomes out of range, or when the signal is in over-voltage condition as indicated by, for example, the positive comparison signal COMPP and/or the positive out-of-range detection signal OVDP. Various logic schemes can be implemented in logic circuits to indicate other conditions that can be addressed by other circuits in the system.

Some examples may permit for adjustable voltage ranges and/or low voltage ranges. As described previously, the reference voltages can be adjustable, as well as the level shifter circuits. The adjustability of the reference voltages and level shifter circuits can provide flexibility in implementing an out-of-range voltage detection circuit with various protected circuits. Further, the low voltage ranges that can be the basis for the voltage range of the out-of-range voltage detection circuit can protect circuits at low voltages (e.g., approximately 1.2 V and/or 2.2 V) and at high voltages. This can effectively protect thin and thick gate dielectric (e.g., oxide) transistor devices that may be implemented in the protected circuit.

Further, some examples can provide a flexible solution that can protect different nodes in a protected circuit for reliable operation. As illustrated in various examples above, various aspects of a logic circuit and/or delay elements may be implemented to accommodate different nodes of a protected circuit to provide reliable operation of the protected circuit.

Although various signals and logic circuits/elements may have been described in the context of implementing a particular logic level, inverse logic or other logic states may be implemented in other examples. As used herein (including the claims that follow), a phrase referring to "at least one of" a list of items refers to any combination of those items, including single members. As an example, "at least one of: x, y, and z" is intended to cover: x, y, z, x-y, x-z, y-z, x-y-z, and any combination thereof (e.g., x-y-y and x-x-y-z).

While the foregoing is directed to examples of the present disclosure, other and further examples of the disclosure may be devised without departing from the basic scope thereof, and the scope thereof is determined by the claims that follow.

What is claimed is:

1. An integrated circuit comprising:
 a first envelope detector having an input node and an output node, the first envelope detector being configured to generate an envelope signal of a signal provided on the input node of the first envelope detector and output the envelope signal on the output node of the first envelope detector;
 a first comparator having a first input node, a second input node, and an output node, the first input node of the first comparator being coupled to the output node of the first envelope detector, the first comparator being configured to compare a first signal provided on the first input node of the first comparator to a second signal provided on the second input node of the first comparator and generate a first comparison signal in response to the comparison, the first comparator further being configured to output the first comparison signal on the output node of the first comparator; and
 a first switch connected between a first protected node and a first protection node, the first switch being configured to be selectively opened or closed between the first protected node and the first protection node based, at least in part, on the first comparison signal.

2. The integrated circuit of claim 1 further comprising a logic circuit having a first input node and an output node, the output node of the first comparator being coupled to the first input node of the logic circuit, the logic circuit being configured to generate a control signal based, at least in part, on the first comparison signal, the logic circuit being configured to output the control signal on the output node of the logic circuit, the first switch being configured to be selectively opened or closed based on the control signal.

3. The integrated circuit of claim 2 further comprising:
 a second envelope detector having an input node and an output node, the second envelope detector being configured to generate a negative envelope signal of a signal provided on the input node of the second envelope detector and output the negative envelope signal on the output node of the second envelope detector; and
 a second comparator having a first input node, a second input node, and an output node, the first input node of the second comparator being coupled to the output node of the second envelope detector, the second comparator being configured to compare a first signal provided on the first input node of the second comparator to a second signal provided on the second input node of the second comparator and generate a second comparison signal in response to the comparison, the second comparator further being configured to output the second comparison signal on the output node of the second comparator; and
 wherein:
  the first envelope detector is configured to generate a positive envelope signal of the signal provided on the input node of the first envelope detector and output the positive envelope signal on the output node of the first envelope detector; and
  the logic circuit has a second input node, the output node of the second comparator being coupled to the second input node of the logic circuit, the logic circuit being configured to generate the control signal based, at least in part, on the second comparison signal.

4. The integrated circuit of claim 3, wherein the logic circuit and the first switch are configured to selectively close the first switch when at least one of: (i) the first comparison signal indicates that the positive envelope signal exceeds a first reference voltage, or (ii) the second comparison signal indicates that the negative envelope signal is below a second reference voltage.

5. The integrated circuit of claim 2 further comprising:
 a delay element having an input node and an output node, the input node of the delay element being coupled to the output node of the logic circuit, the delay element being configured to generate a delayed control signal based on the control signal, the delay element further being configured to output the delayed control signal on the output node of the delay element; and a second switch connected between a second protected node and a second protection node, the second switch being configured to be selectively opened or closed between the second protected node and the second protection node based on the delayed control signal.

6. The integrated circuit of claim 5, wherein the delay element is programmable to adjust a delay of the delay element.

7. The integrated circuit of claim 1 further comprising:

a first level shifter circuit having an input node and an output node, the input node of the first level shifter circuit being coupled to the output node of the first envelope detector, the output node of the first level shifter circuit being coupled to the first input node of the first comparator; and a second level shifter circuit having an input node and an output node, the input node of the second level shifter circuit being coupled to a reference voltage node, the output node of the second level shifter circuit being coupled to the second input node of the first comparator.

8. The integrated circuit of claim 7, wherein each of the first level shifter circuit and the second level shifter circuit is programmable to adjust a respective level shift amount.

9. The integrated circuit of claim 1, wherein:

the first protected node is internal to a protected circuit; and the first envelope detector and the first comparator are disposed on a same chip as the protected circuit.

10. A method of operating an integrated circuit, the method comprising:

generating a first envelope signal of an input signal;

comparing the first envelope signal to a first reference voltage to generate a first comparison signal;

generating a control signal based on, at least in part, the first comparison signal; and selectively opening or closing a first switch based on the control signal, the first switch being coupled between a first protected node and a first protection node.

11. The method of claim 10 further comprising:

generating a second envelope signal of the input signal, the first envelope signal being a positive envelope signal, the second envelope signal being a negative envelope signal; and comparing the second envelope signal to a second reference voltage to generate a second comparison signal, the control signal further being based on, at least in part, the second comparison signal.

12. The method of claim 11, wherein the control signal indicates an occurrence of an event, the event occurring when (i) the positive envelope signal exceeds the first reference voltage, (ii) the negative envelope signal is below the second reference voltage, and (iii) both (i) and (ii).

13. The method of claim 10 further comprising:

generating a delayed control signal based on the control signal; and selectively opening or closing a second switch based on the delayed control signal, the second switch being coupled between a second protected node and a second protection node.

14. The method of claim 10 further comprising:

selectively opening or closing a second switch based on the control signal, the second switch being coupled between a second protected node and a second protection node.

15. The method of claim 10, wherein comparing the first envelope signal to the first reference voltage comprises:

level shifting the first envelope signal to a shifted envelope signal; and level shifting the first reference voltage to a shifted reference voltage, the shifted envelope signal being compared to the shifted reference voltage.

16. An integrated circuit comprising:

a detection circuit comprising:

a first envelope detector having an output node, the first envelope detector being configured to output a first detected envelope signal on the output node of the first envelope detector; and a first comparator having a first input node, a second input node, and an output node, the first input node of the first comparator being coupled to the output node of the first envelope detector to receive the first detected envelope signal, the first comparator being configured to output a first comparison signal on the output node of the first comparator, the first comparison signal being based on a comparison of the first detected envelope signal to a signal on the second input node of the first comparator;

a protected circuit having an internal node; and a protection circuit comprising a switch coupled between the internal node and a protection node, the switch being controlled to be in an open state or a closed state based on, at least in part, the first comparison signal.

17. The integrated circuit of claim 16, wherein the detection circuit further comprises:

a second envelope detector having an output node, the second envelope detector being configured to output a second detected envelope signal on the output node of the second envelope detector;

a second comparator having a first input node, a second input node, and an output node, the first input node of the second comparator being coupled to the output node of the second envelope detector to receive the second detected envelope signal, the second comparator being configured to output a second comparison signal on the output node of the second comparator, the second comparison signal being based on a comparison of the second detected envelope signal to a signal on the second input node of the second comparator; and logic circuit having a first input node, a second input node, and an output node, the first input node of the logic circuit being coupled to the output node of the first comparator, the second input node of the logic circuit being coupled to the output node of the second comparator, the logic circuit being configured to output on the output node of the logic circuit a control signal based on the first comparison signal and the second comparison signal, the output node of the logic circuit being coupled to a control node of the switch to control the switch to be in the open state or the closed state.

18. The integrated circuit of claim 17, wherein:

the first detected envelope signal is a positive envelope signal;

the second detected envelope signal is a negative envelope signal;

the first comparison signal indicates when the positive envelope signal exceeds the signal on the second input node of the first comparator; and the second comparison signal indicates when the negative envelope signal is below the signal on the second input node of the second comparator.

19. The integrated circuit of claim 16, wherein the protection circuit further comprises a voltage generator circuit, the protection node being a node of the voltage generator circuit.

20. The integrated circuit of claim 16, wherein the detection circuit, the protected circuit, and the protection circuit are disposed on a same chip.

* * * * *